(12) United States Patent
Sakakibara

(10) Patent No.: US 7,379,359 B2
(45) Date of Patent: May 27, 2008

(54) NONVOLATILE SEMICONDUCTOR MEMORY

(75) Inventor: Motoko Sakakibara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 123 days.

(21) Appl. No.: 11/502,423

(22) Filed: Aug. 11, 2006

(65) Prior Publication Data

US 2007/0230263 A1 Oct. 4, 2007

(30) Foreign Application Priority Data

Mar. 30, 2006 (JP) ............................. 2006-093310

(51) Int. Cl.
*G11C 29/00* (2006.01)
(52) U.S. Cl. .................. 365/200; 365/185.09
(58) Field of Classification Search ............... 365/200, 365/185.09, 201
See application file for complete search history.

(56) References Cited

U.S. PATENT DOCUMENTS 5,257,229 A * 10/1993 McClure et al. ............ 365/200
5,293,348 A * 3/1994 Abe ....................... 365/230.03
6,002,620 A 12/1999 Tran
6,992,937 B2 * 1/2006 Tran et al. .................. 365/200
7,054,206 B2 * 5/2006 Tellier ........................ 365/200

FOREIGN PATENT DOCUMENTS

JP 11-339488 A 12/1999
JP 2000-207894 A 7/2000

* cited by examiner

*Primary Examiner*—Anh Phung
(74) *Attorney, Agent, or Firm*—Arent Fox, LLP.

(57) ABSTRACT

A regular sense amplifier and a defect-information sense amplifier are provided for each regular sector and each defect-information sector, respectively. This can prevent an excess load from being applied to a read path, and minimize the access time. A write amplifier is provided in common to the regular sector, the reference sector, and the defect-information sector. Generally, the write operation time of a nonvolatile semiconductor memory is long, so that an increase in a wiring load on a data transmission path and an increase in a load on a switch do not affect the write operation time much. As a result, the circuit scale can be made smaller without lengthening the read access time, and thereby the fabrication cost of the nonvolatile semiconductor memory can be reduced.

12 Claims, 15 Drawing Sheets

| mode | | IN | XIN | SECYC | SECYCR | ERPGMV | SEN | PRE | REF0 | REF1 | DEFY | DEFWL |
|---|---|---|---|---|---|---|---|---|---|---|---|---|
| RD | | PGM state | ER state | H | H | L | H | H | L | L | L | VCC |
| | | ER state | PGM state | H | H | L | H | H | L | L | L | VCC |
| ER | | ER state | ER state | H | H | L | L | L | L | L | H | -9V |
| EVR | | ER state | REF | H | L | H | H | H | H | L | L | 0 |
| | | REF | ER state | L | H | H | H | H | L | H | L | 0 |
| PRG | | PGM state | ER state | H | L | L | L | L | L | L | H | 9V |
| | | ER state | PGM state | L | H | L | L | L | H | L | H | 9V |
| PVR | | PGM state | REF | H | L | H | H | H | L | L | L | VCC |
| | | REF | PGM state | L | H | H | H | H | L | H | L | VCC |

Fig. 10

| memory cell | mode | YD2 (0),(1) | YD1 (0)-(3) | YD1R | RYD1 | SECY 0-7 | SECYR 0-1 | SECYC | SECYCR | DEFY | WL | DEFWL | REFWL |
|---|---|---|---|---|---|---|---|---|---|---|---|---|---|
| MC,RMC | RD | off | sel | sel | sel | sel | sel | off | off | off | BST | 0 | BST |
| | WR | sel | sel | off | sel | sel | off | off | off | off | 9V | 0 | 0 |
| | ER | off | on | off | on | on | off | off | off | off | -9V | 0 | 0 |
| | VR | sel | sel | off | sel | sel | off | off | off | off | 3-5V | 0 | 0 |
| DEFMC | RD | off | off | off | off | off | off | on | on | off | 0 | VCC | 0 |
| | PRG | sel | sel | off | off | off | off | sel | sel | on | 0 | 9V | 0 |
| | ER | off | on | on | on | off | off | on | on | on | 0 | -9V | 0 |
| | VR | off | off | off | off | off | off | sel | sel | off | 0 | 0V/VCC | 0 |
| REFMC | RD | off | off | sel | sel | sel | sel | off | off | off | BST | 0 | BST |
| | PRG | sel | off | sel | off | off | sel | off | off | off | 0 | 0 | 2-3V |
| | ER | off | off | on | off | off | on | off | off | off | 0 | 0 | -9V |
| | VR | sel | off | sel | off | sel | sel | off | off | off | 0 | 0 | 3-5V |

Fig. 14

NONVOLATILE SEMICONDUCTOR MEMORY

CROSS REFERENCE TO RELATED APPLICATION

This application is based upon and claims the benefit of priority from Japanese Patent Application No. 2006-093310, filed on Mar. 30, 2006, the entire contents of which are incorporated herein by reference.

BACKGROUND OF THE INVENTION

1. Field of the Invention

The present invention relates to a nonvolatile semiconductor memory including a redundancy circuit to relieve a defect.

2. Description of the Related Art

Generally, a semiconductor memory includes a redundancy circuit in order to improve the yield by relieving defects caused by a lattice defect in a substrate and foreign particles produced in a fabrication process. For example, a nonvolatile memory such as a flash memory includes a redundancy word line or a redundancy bit line in addition to normal word lines or bit lines. When a defect in a memory cell is detected in a test process, defect information indicating the address of the defective memory cell is programmed into a fuse circuit or the like in order to replace the word line or the bit line connected to the defective memory cell with the redundancy word line or the redundancy bit line. Relieving the defective memory cell using the redundancy circuit improves the yield of the semiconductor memory. For example, the fuse circuit into which the defect information is programmed is formed outside a memory cell array (for example, Japanese Unexamined Patent Application Publication No. Hei 11-339488).

Also, a method of programming the defect information into a nonvolatile memory cell (defect-information memory cell) in the nonvolatile semiconductor memory is disclosed. This kind of nonvolatile semiconductor memory is provided with a dedicated programming circuit to program the defect information into each defect-information memory cell and a dedicated sense amplifier to read the defect information from the defect-information memory cell (for example, Japanese Unexamined Patent Application Publication No. 2000-207894).

However, providing a dedicated control circuit for accessing the defect-information memory cell increases the chip size of the nonvolatile semiconductor memory. Especially, in case that Contents Addressable Memory cell (CAM cell) is used as the defect-information memory cell, the chip size becomes larger. Moreover, in a normal read operation, it is desirable to determine whether or not to use the redundancy circuit as soon as possible in order to shorten the access time.

SUMMARY OF THE INVENTION

An object of the present invention is to make smaller the circuit scale of a nonvolatile semiconductor memory including a redundancy circuit without lengthening the access time.

A nonvolatile semiconductor memory includes a regular sector and a defect-information sector. The regular sector includes a plurality of nonvolatile regular memory cells, regular bit lines connected to the regular memory cells, a nonvolatile redundancy memory cell to relieve a defective regular memory cell, and a redundancy bit line connected to the redundancy memory cell. The defect-information sector includes a plurality of nonvolatile defect-information memory cells storing defect information indicating a position of the defective regular memory cell, and includes defect-information bit lines connected to the defect-information memory cells. In the present invention, CAM cells are not needed as nonvolatile defect-information memory cells. A regular sense amplifier is connected to the regular bit line to read data stored in the regular memory cells. A defect-information sense amplifier is connected to the defect-information bit line to read the defect information stored in the defect-information memory cells. The regular sense amplifier and the defect-information sense amplifier are formed for the regular sector and the defect-information sector, respectively, by which excess loads (wirings and switches) can be prevented from being arranged in a path from the regular memory cell to the regular sense amplifier. As a result, a normal read operation of reading data from the regular memory cell can be performed at high speed.

A write amplifier is connected to the regular bit line to write data into the regular memory cells. Further, the write amplifier is connected to the defect-information bit line via the regular bit line and a defect-information switch to write defect-information into the defect-information memory cells. Namely, the write amplifier is provided in common to the regular sector and the defect-information sector. Generally, the write operation time (program operation time) of the nonvolatile semiconductor memory is long. Hence, when the write amplifier is provided in common to the regular sector and the defect-information sector in order to reduce the circuit scale, an increase in a wiring load on a data transmission path and an increase in a load on a switch do not affect the write operation time much. As a result, the circuit scale can be made smaller without lengthening the read access time, and thereby the fabrication cost of the nonvolatile semiconductor memory can be reduced.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 10 is a state chart showing operations of the defect-information sense amplifier shown in FIG. 9:

FIG. 13 is a timing diagram showing the operations of the defect-information sense amplifier and the defect-information latch shown in FIG. 4 at power-on;

FIG. 14 is a state chart showing the operation of the memory cell array shown in FIG. 2.

DESCRIPTION OF THE PREFERRED EMBODIMENTS

Figure 1:
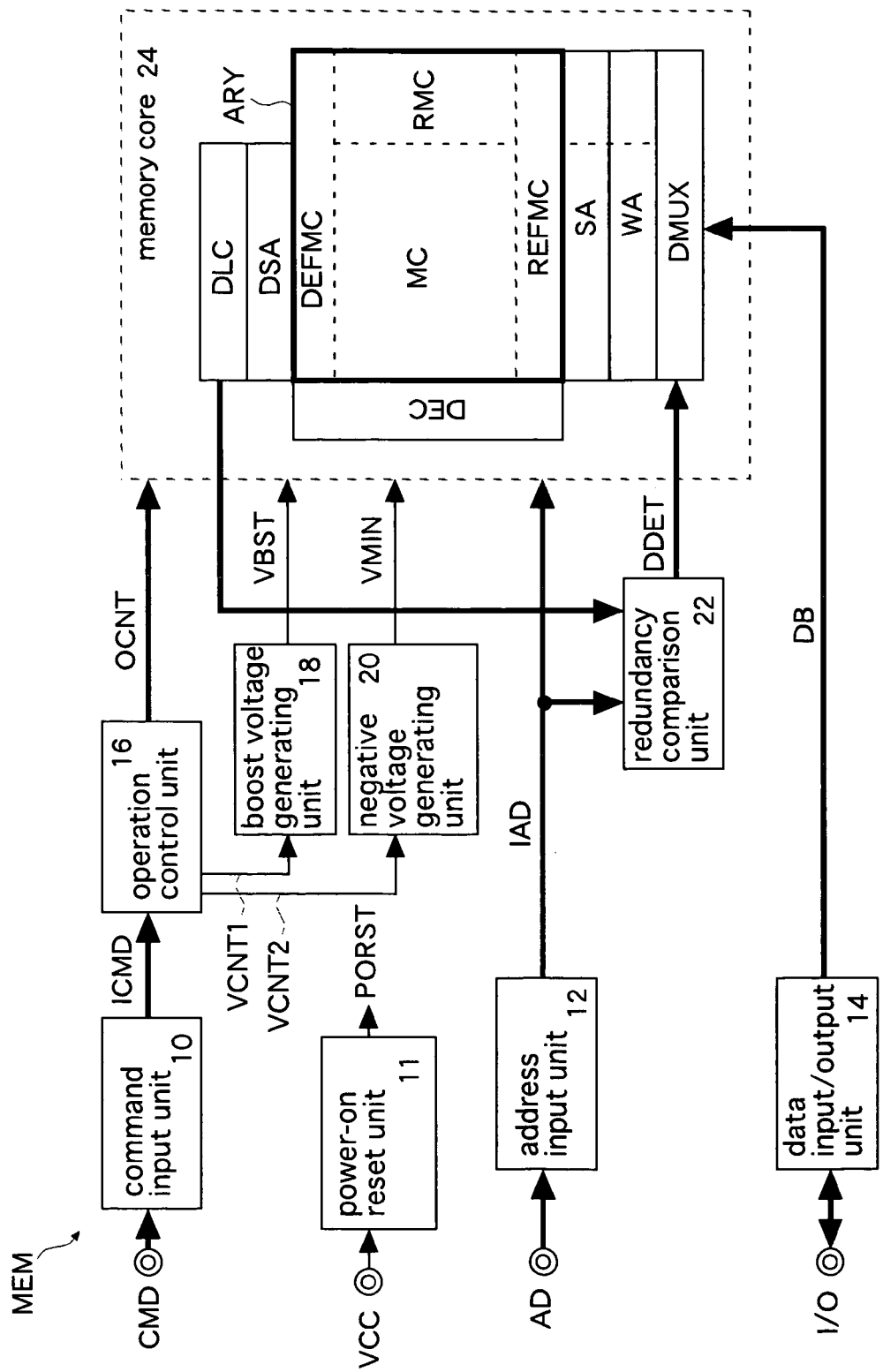
FIG. 1 is a block diagram showing a nonvolatile semiconductor memory of a first embodiment of the present invention.

Preferred embodiments of the invention will now be described with reference to the accompanying drawings. In the drawings, double circles denote an external terminal, and a bold signal line denotes a plurality of signal lines. A part of a block connected to a bold line is composed of a plurality of circuits. A signal line through which a signal is transferred is denoted by a symbol equal to the name of the signal.

FIG. 1 shows a nonvolatile semiconductor memory of a first embodiment of the present invention. A semiconductor memory MEM is, for example, a NOR-type flash memory. The memory MEM includes a command input unit 10, a power-on reset unit 11 (a power-on control unit), an address input unit 12, a data input/output unit 14, an operation control unit 16, a boost voltage generating unit 18, a negative voltage generating unit 20, a redundancy comparison unit 22, and a memory core 24.

The command input unit 10 receives a command CMD supplied to a command terminal CMD and outputs the received command CMD as an internal command ICMD to the operation control unit 16. In this embodiment, a read command, a write command (program command), an erase command, and a test command are supplied as the commands CMD to the command input unit 10. As will be described later, the test command is supplied when the threshold voltage of a reference memory REFM is set and when defect information is written into a defect-information memory cell DEFMC. The test command is used only in a test process of the memory MEM, and a user (system equipped with the memory MEM) is not allowed to use it.

When the memory MEM is powered on, the power-on reset unit 11 detects that a power supply voltage VCC rises to a predetermined value and outputs a power-on reset signal PORST.

The address input unit 12 receives an external address AD supplied to an address terminal AD, and outputs the received external address AD as an internal address IAD to the redundancy comparison unit 22 and the memory core 24. The address AD is supplied to access a regular memory cell MC during a normal operation mode and used to access the reference memory cell REFMC and the defect-information memory cell DEFMC during a test mode. The normal operation mode is an operation mode for the user to access the memory cell MC.

The data input/output unit 14 outputs read data outputted from the memory core 24 via a data bus DB to a data terminal I/O in a read operation and outputs write data received by the data terminal I/O to the memory core 24 via the data bus DB in a write operation (program operation). The data terminal I/O is a terminal common to the read data and the write data and, for example, composed of 32 bits (I/O0-31).

In response to the internal command ICMD, the operation control unit 16 outputs an operation control signal OCNT to control the operation of the memory core 24 and voltage control signals VCNT1-2 to control the operations of the boost voltage generating unit 18 and the negative voltage generating unit 20. In response to the voltage control signal VCNT1, the boost voltage generating unit 18 generates a boost voltage VBST (for example, 5 V and 9 V). The boost voltage VBST is supplied to a word line in the read operation and the write operation. In response to the voltage control signal VCNT2, the negative voltage generating unit 20 generates a negative voltage VMIN (for example, −9 V). The negative voltage VMIN is supplied to a word line, for example, in an erase operation.

During the normal operation mode, the redundancy comparison unit 22 compares the address AD supplied in the read operation and the write operation and a defect address (defect information) outputted from a later-described defect-information latch DLC. When the address AD and the defect address match, the redundancy comparison unit 22 activates a defect detecting signal DDET. Consequently, access to a regular data area D0-31 (FIG. 3) corresponding to a terminal number (defect information) of defect data outputted from the defect-information latch DLC is prohibited, and instead, access to a redundancy data area RD0-1 (FIG. 3) is permitted.

Figure 2:
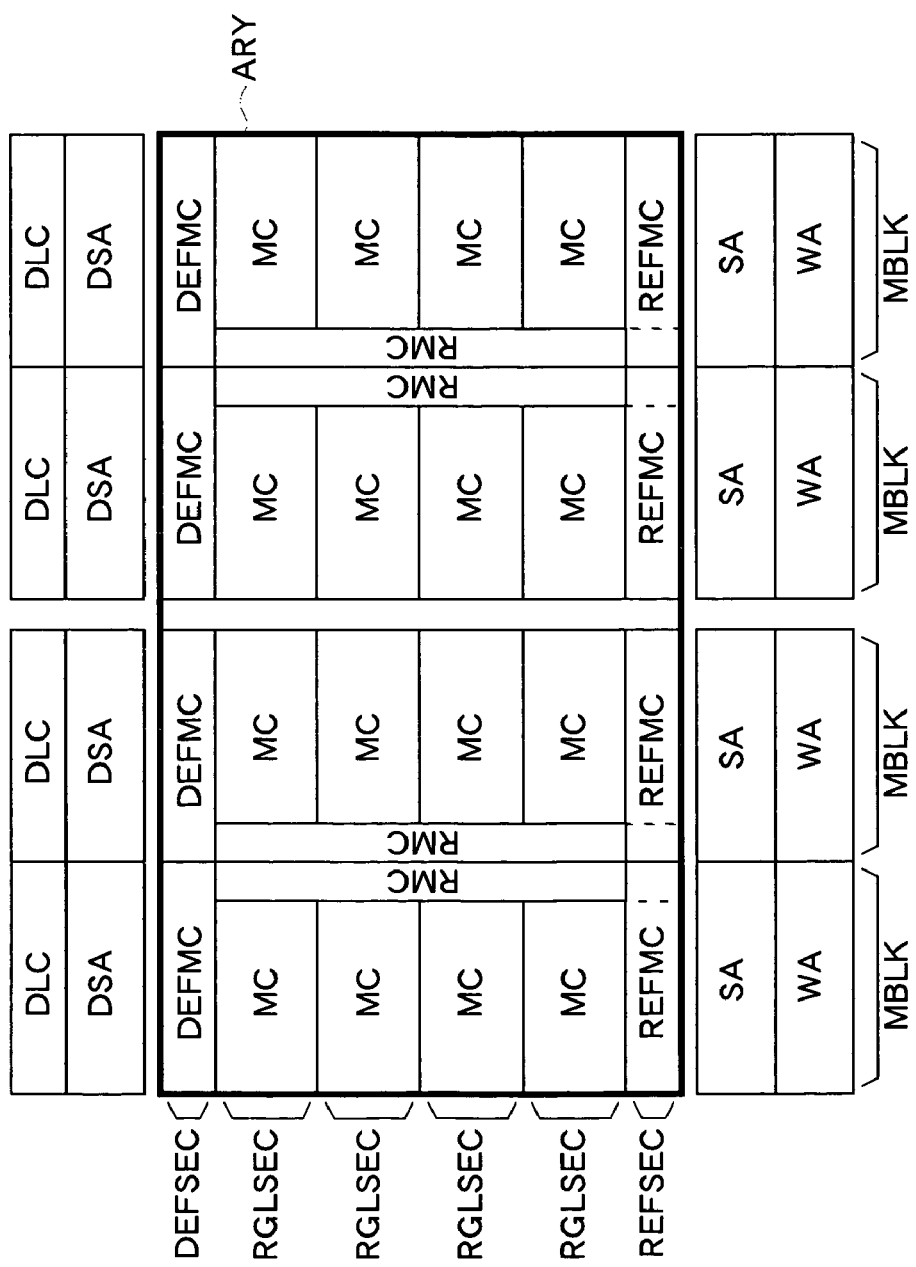
FIG. 2 is a block diagram showing details of a memory cell array shown in FIG. 1.

The memory core 24 includes a memory cell array ARY, an address decoder DEC, a regular sense amplifier SA, a write amplifier WA, a data multiplexer DMUX, the defect-information latch DLC, and a defect-information sense amplifier DSA. As shown in FIG. 2 described later, the memory cell array ARY includes a defect-information sector DEFSEC including the defect-information memory cells DEFMC, a regular sector RGLSEC including the regular memory cells MC and redundancy memory cells RMC, and a reference sector REFSEC including the reference memory cells REFMC. The memory capacity of the memory cell array ARY accessible to the user is, for example, 1 Mbyte. Details of the memory cell array ARY will be described later using FIG. 2 to FIG. 8.

During the normal operation mode, the address decoder DEC decodes the address AD and outputs a decoded signal in order to access the nonvolatile memory cells MC, RMC. Further, during the test mode, the address decoder DEC decodes the address AD and outputs a decoded signal in order to access the nonvolatile memory cells DEFMC, REFMC. The sense amplifier SA amplifies the signal amount of data read from the memory cell MC or the redundancy memory cell RMC using the reference memory cell REFMC and outputs the amplified data to the data multiplexer DMUX. The write amplifier WA outputs data to be written into the memory cells MC, RMC, and outputs data for setting the threshold voltages of the defect-information memory cell DEFMC and the reference memory cell REFMC to a predetermined value to the memory cell array ARY.

In the read operation, the data multiplexer DMUX outputs data read from the regular data area D0-31 to the data bus DB during the deactivation of the defect detecting signal DDET. In the read operation, the data multiplexer DMUX outputs data read from the regular data area D0-31 in which no defect exists to the data bus DB and outputs data read from the redundancy data area RD0-1 in place of the regular data area D0-31 in which a defect exists to the data bus DB during the activation of the defect detecting signal.

Further, in the write operation, the data multiplexer DMUX outputs write data to the write amplifier WA corresponding to the regular data area D0-31 during the deactivation of the defect detecting signal DDET. In the write operation, the data multiplexer DMUX outputs the write data to the write amplifier WA corresponding to the regular data area D0-31 in which no defect exists and outputs the write data to the write amplifier WA corresponding to the redundancy data area RD0-1 in place of the regular data area D0-31 in which a defect exists during the activation of the defect detecting signal.

The defect-information sense amplifier DSA amplifies the signal amount of complementary data (one piece of defect information) read from a pair of the defect-information memory cells DEFMC. The defect-information sense amplifier DSA is a sense amplifier dedicated to the defect-information memory cells DEFMC. The defect-information latch DLC holds the defect information (defect address and defect data terminal number) amplified by the defect-information sense amplifier DSA.

FIG. 2 shows details of the memory cell array ARY shown in FIG. 1. The memory cell array ARY is composed of four memory blocks MBLK. The memory blocks MBLK have the same structure except that they are mirror symmetric to each other. Each of the memory blocks MBLK includes four regular sectors RGLSEC arranged in the longitudinal direction of the figure, and a defect-information sector DEFSEC and a reference sector REFSEC arranged on both sides of the regular sectors RGLSEC (at the top and bottom of the figure). The memory capacity of each memory block MBLK accessible to the user is 256 kbytes. The regular sector RGLSEC includes the regular memory cells MC and the redundancy memory cells RMC. The memory capacity of each regular sector RGLSEC is 64 kbytes.

Figure 3:
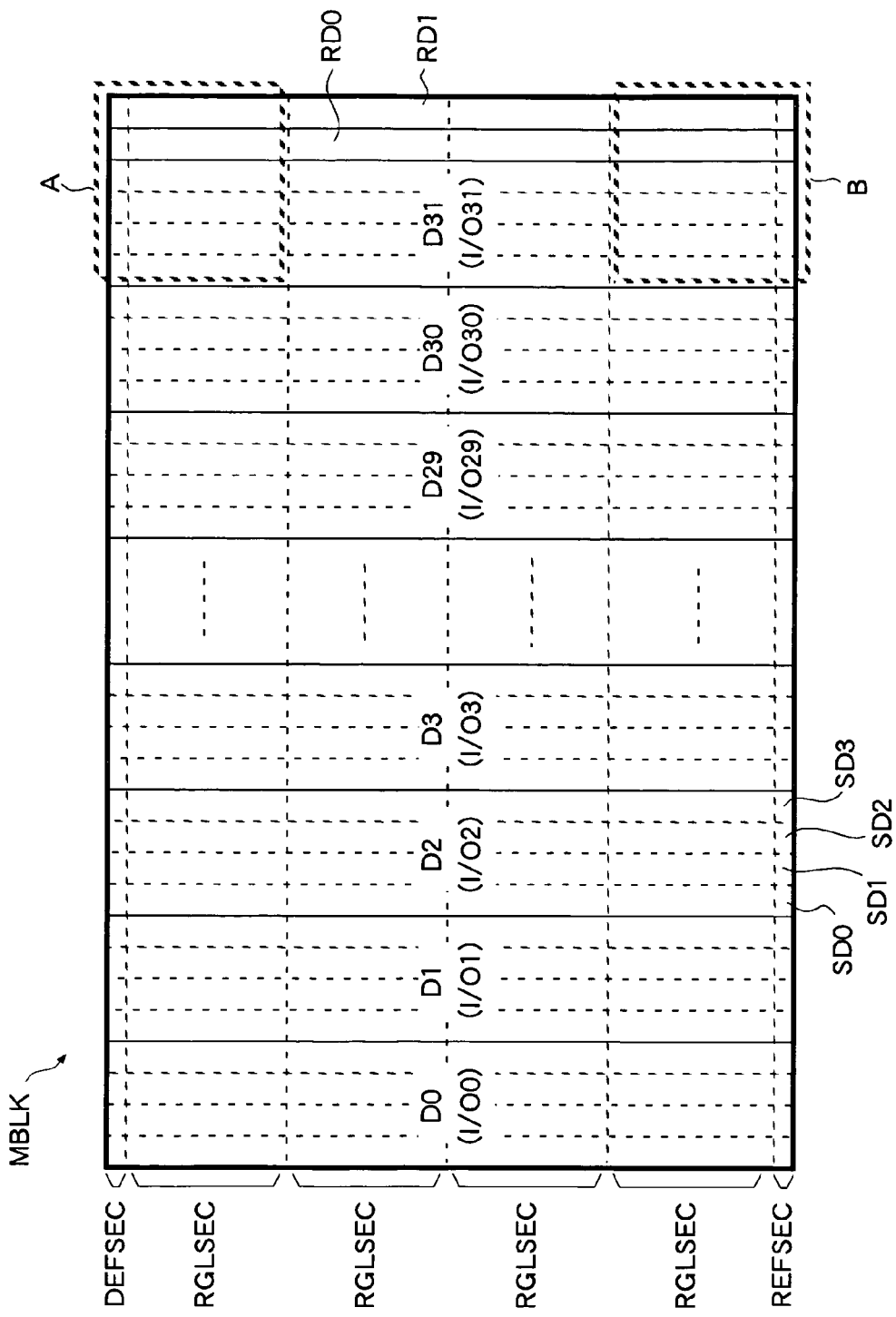
FIG. 3 is a block diagram showing details of a memory block shown in FIG. 2.

FIG. 3 shows details of the memory block MBLK shown in FIG. 2. The memory block MBLK includes regular data areas D0-31 corresponding to the data terminals I/O0-31, respectively, and the redundancy data areas RD0-1. Each regular data area D0-31 includes four sub-data areas SD0-3 which are long in the longitudinal direction in the figure. The memory capacity of each data area D0-31 is 8 kbytes (64 kbits).

Each redundancy data area RD0-1 has the same memory capacity as each sub-data area SD0-3. Namely, the memory capacity of each redundancy data area RD0-1 is 2 kbites (16 kbites.) In each memory block MBLK, up to two sub-data areas SD can be replaced with the redundancy data areas RD0-1. Bold dotted-line frames A and B in the figure correspond to FIG. 4 and FIG. 5 described later.

Figure 4:
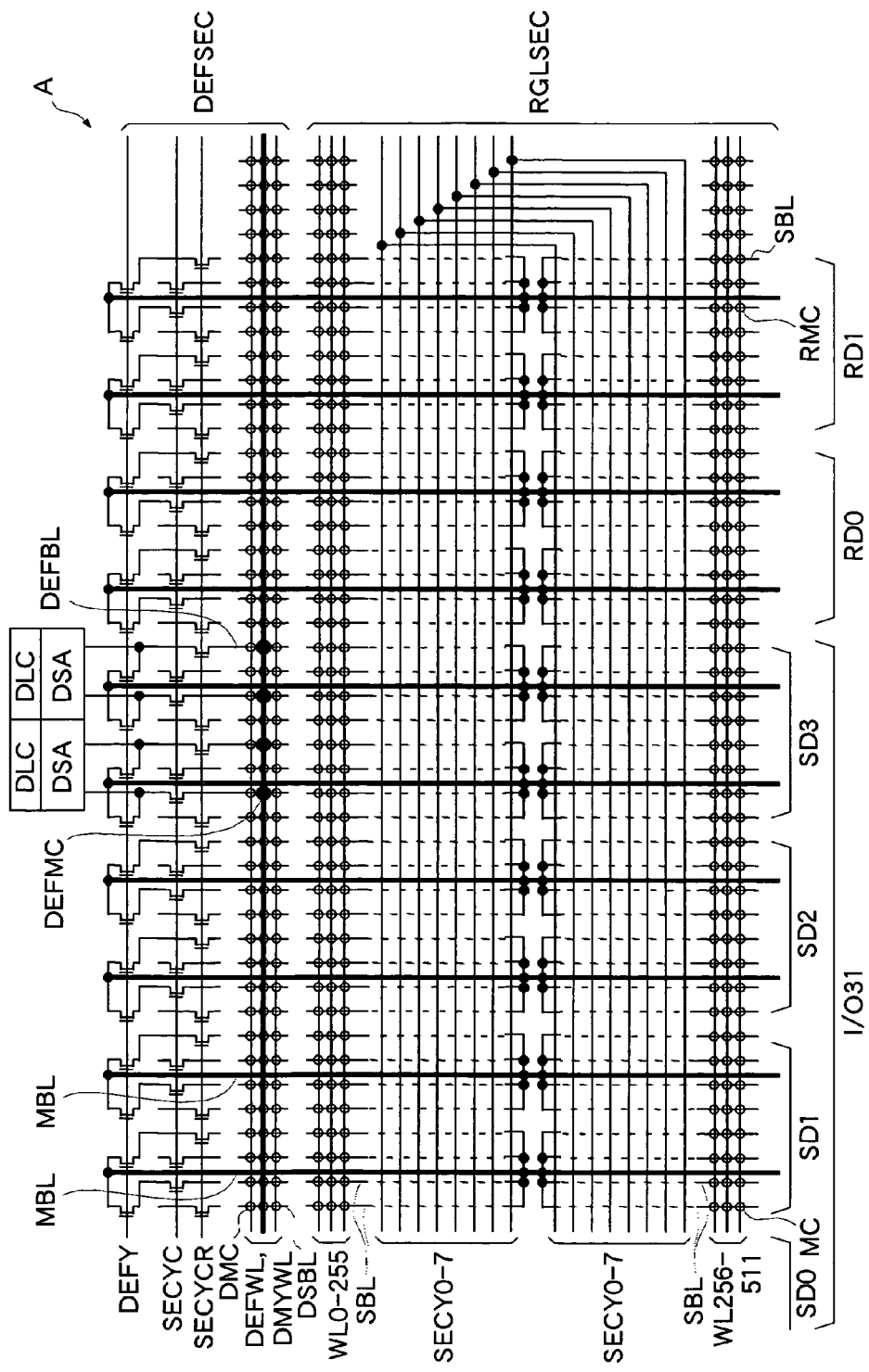
FIG. 4 is a block diagram showing details of an area A shown in FIG. 3.
Figure 5:
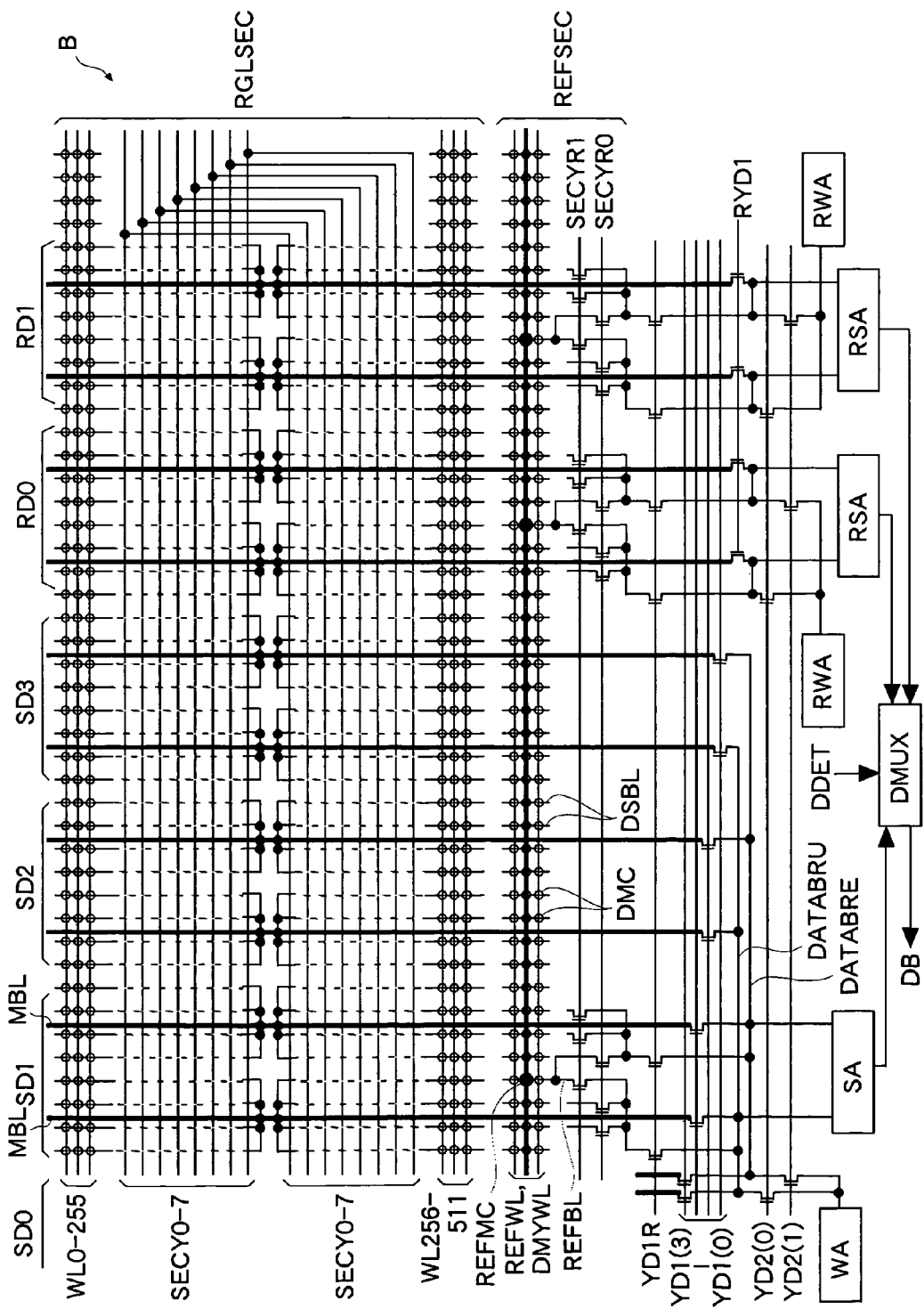
FIG. 5 is a block diagram showing details of an area B shown in FIG. 3.

FIG. 4 shows details of the area A shown in FIG. 3. Each sub-data area SD0-3 includes a pair of two main bit lines MBL (regular bit lines) and four sub-bit lines SBL (regular bit lines) which branch out from each main bit line MBL. The sub-bit lines SBL are connected to the main bit line MBL via nMOS transistors (switches) not shown which receive regular decoded signals SECY0-7 at their gates, respectively. To each sub-bit line SBL, 256 regular memory cells MC (circles in the figure) connected to regular word lines WL0-255 or WL256-511 are connected. Namely, the sub-bit lines SBL of the regular sector RGLSEC are electrically divided into two up and down via nMOS transistors (switches). In FIG. 4, out of the word lines WL0-255 and the word lines WL256-511, respectively, only three lines are shown, and the remaining 253 lines are not shown. As shown in FIG. 4 and FIG. 5, the main bit line MBL (bold line extending in the longitudinal direction) is laid over the defect-information sector DEFSEC, the regular sector RGLSEC, and the reference sector REFSEC.

Each redundancy data area RD0-1 has the same structure as the sub-data area SD1, for example. Namely, each redundancy data area RD0-1 includes two main bit lines MBL (redundancy bit lines) and four sub-bit lines SBL (redundancy bit lines) which branch out from each main bit line MBL. To each sub-bit line SBL, 256 redundancy memory cells RMC connected to regular word lines WL0-255 or WL256-511 are connected.

The defect-information sector DEFSEC includes one defect-information word line DEFWL shown by a bold line extending in the lateral direction in the figure and nine dummy word lines DMYWL. In FIG. 4, out of the dummy word lines DMYWL, only two lines are shown, and the remaining seven lines are now shown. Dummy memory cells DMC shown by circles in the figure are connected to the dummy word line DMYWL. The dummy memory cells DMC are connected to a dummy sub-bit line DSBL corresponding to the sub-bit line SBL. The dummy memory cells DMC and four defect-information memory cells DEFMC shown by bold circles in the figure are connected to the defect-information word line DEFWL. Incidentally, the regular memory cells MC, the defect-information memory cells DEFMC, the redundancy memory cells RMC, and the dummy memory cells DMC have the same cell structure, and they are laid out at the same intervals. Therefore, the defect-information memory cell DEFMC having the same characteristic as the regular memory cell MC can be easily formed. Moreover, since cells used in layout design can be made common, the design period can be shortened.

The defect-information memory cells DEFMC are formed corresponding to the main bit lines MBL of the sub-data area SD3 in each of the data areas D0-31 shown in FIG. 3 and each connected to a defect-information bit line DEFBL. A pair of defect-information bit lines DEFBL corresponding to each main bit line MBL are connected to the defect-information sense amplifier DSA. The defect-information bit lines DEFBL are connected to the main bit line MBL by nMOS transistors (defect-information switches) which receive a defect-information decoded signal DEFY at their gates and nMOS transistors (switches) which receive defect-information decoded signals SECYC, SECYCR at their gates. The main bit line MBL can be completely cut off from the defect-information sector DEFSEC by the defect-information switches. Details of the defect-information sector DEFSEC will be described later using FIG. 7.

Incidentally, the dummy memory cell DMC of the defect-information sector DEFSEC can be used as the defect-information memory cell DEFMC by connecting an effective word line and an effective bit line thereto. In other words, the number of the defect-information memory cells DEFMC can be increased as needed if the layout area of the defect-information sense amplifier DSA and the defect-information latch DLC can be secured. In this case, the memory MEM having a large number of defect-information memory cells DEFMC can be redesigned in a short development period.

FIG. 5 shows details of the area B shown in FIG. 3. The configuration of the regular sector RGLSEC is the same as that in FIG. 4. The reference sector REFSEC includes one reference word line REFWL shown by a bold line in the figure and nine dummy word lines DMYWL. In FIG. 5, out of the dummy word lines DMYWL, only two lines are shown and the remaining seven lines are not shown. As in the case of the defect-information sector DEFSEC shown in FIG. 4, the dummy memory cells DMC shown by circles in the figure are connected to the dummy word line DMYWL. The dummy memory cell DMC is connected to the dummy sub-bit line DSBL corresponding to the sub-bit line SBL.

The dummy memory cells DMC and one reference memory cell REFMC shown by a bold circle in the figure are connected to the reference word line REFWL. The reference memory cell REFMC is formed in each of the sub-data area SD1 of each of the data areas D0-31 and the redundancy data areas RD0-1 shown in FIG. 3.

The reference memory cell REFMC is connected to a reference bit line REFBL. The reference bit line REFBL is connected to the regular sense amplifier SA and the main bit lines MBL via nMOS transistors which receive reference decoded signals SECYR0-1, YD1R, YD1(0)-YD1(3) at their gates. To put it in detail, the reference bit line REFBL is connected to one input of the sense amplifier SA when the decoded signal SECYR0 is at a high logic level and connected to the other input of the sense amplifier Sa when the decoded signal SECYR1 is at a high logic level.

As just described, the nMOS transistors which receive the reference decoded signals SECYR0-1, YD1R, and YD1(0)-YD1(3) at their gates operate as reference switches which connect the reference memory cell REFMC to the regular bit line MBL connected to the regular memory cell MC which is not accessed via the reference bit line REFBL. Incidentally, in the read operation of the memory MEM, the sense amplifier SA is connected to any of pairs of main bit lines MBL corresponding to the data areas SD0-3 by the nMOS transistors which receive the regular decoded signals YD1 (0)-YD1(3) at their gates.

The reference bit lines REFBL are connected to the write amplifiers WA, respectively, via nMOS transistors which receive the reference decoded signals SECYR0-1, YD1R, and write decoded signals YD2(0), YD2(1). The write decoded signals YD2(0), YD2(1) are supplied in the write operation of the memory MEM. In this case, write data outputted from the write amplifier WA is supplied to either of the pair of main bit lines MBL according to the logic level of the write decoded signals YD2(0,) YD2(1).

The configuration of switches which connect the reference memory cell REFMC formed in the redundancy data area RD0-1 to the redundancy sense amplifier RSA and the redundancy write amplifier RWA is the same as the above-described configuration. Note, however, that the pair of main bit lines MBL of each redundancy data area RD0-1 is connected to the redundancy sense amplifier RSA by nMOS transistors which receive a redundancy decoded signal RYD1 at their gates. Incidentally, the regular memory cells MC, the reference memory cells REFMC, the redundancy memory cells RMC, and the dummy memory cells DMC have the same cell structure, and they are laid out at the same intervals. Therefore, the reference memory cell DEFMC having the same characteristic as the regular memory cell MC can be easily formed. Moreover, since cells used in layout design can be made common, the design period can be shortened.

As described above, in the read operation, the data multiplexer DMUX outputs data read from the regular data area D0-31 to the data bus DB during the deactivation of the defect detecting signal DDET, and outputs data read from either of the redundancy data areas RD0-1 to the data bus DB during the activation of the defect detecting signal DDET. Namely, the data multiplexer DMUX operates an access switching circuit which, when the defect information held in a latch circuit LT shown FIG. 11 described later indicates the position of the regular memory cell MC to be accessed, enables the redundancy memory cell RMC in place of the regular memory cell MC to be accessed.

Incidentally, the dummy memory cell DMC is usable as the reference memory cell REFMC by connecting an effective word line and an effective bit line thereto. In other words, the number of the reference memory cells REFMC can be increased as needed.

As shown in FIG. 4 and FIG. 5, in the memory cell array ARY, dummy elements such as the dummy memory cells DMC and transistors are arranged in a peripheral portion and so on. By arranging the dummy elements, characteristics of the transistors can be made uniform, and wiring width and so on can be made uniform. Moreover, a common layout pattern can be repeatedly used, so that layout design is facilitated. Details of the reference sector REFSEC will be described later using FIG. 8.

Figure 6:
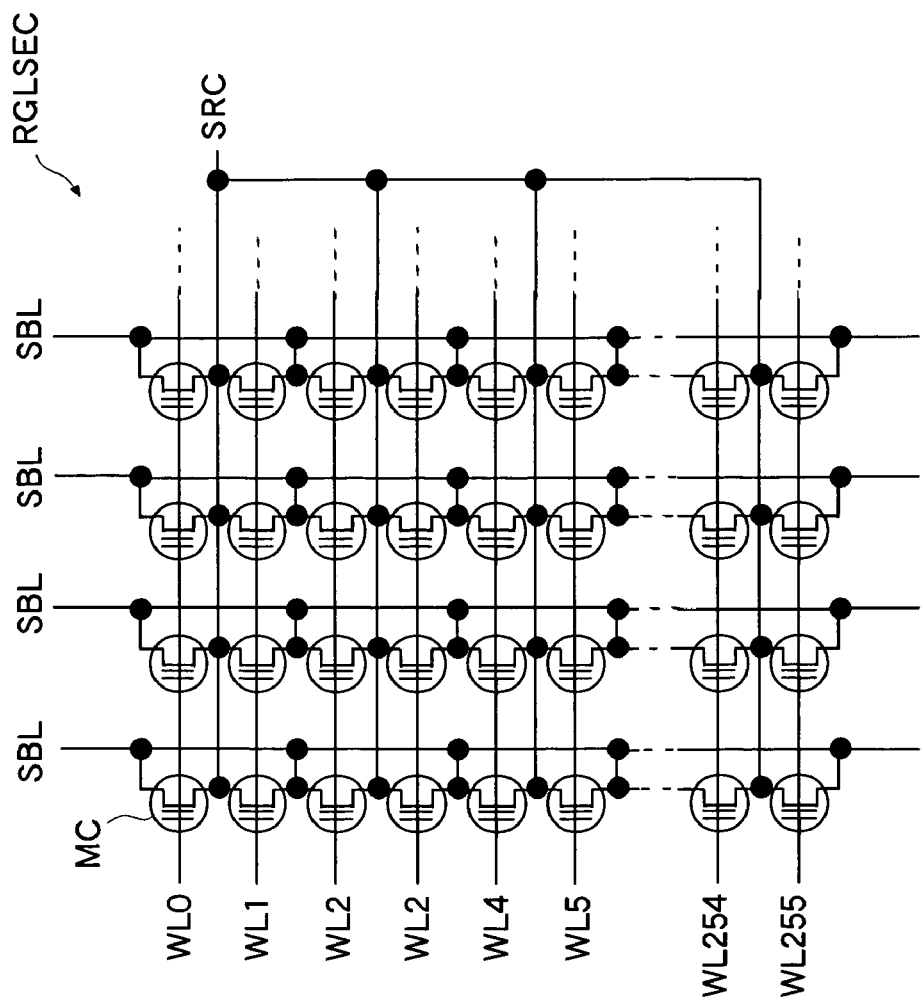
FIG. 6 is a circuit diagram showing details of a regular sector shown in FIG. 2.

FIG. 6 shows details of the regular sector RGLSEC shown in FIG. 2. The nonvolatile memory MEM has a general NOR-type array structure. Each regular memory cell MC includes, for example, a floating gate, and its control gate is connected to the word line WL. A drain and a source of each memory cell MC are connected to a sub-bit line SBL and a common source line SRC, respectively. For example, each of the regular sectors RGLSEC is wired in common by the source line SRC. Therefore, the erase operation is performed on the sector RGLSEC by sector RGLSEC basis. Incidentally, the defect-information sector DEFSEC and the reference sector REFSEC also have the NOR-type structure shown in FIG. 6.

Figure 7:
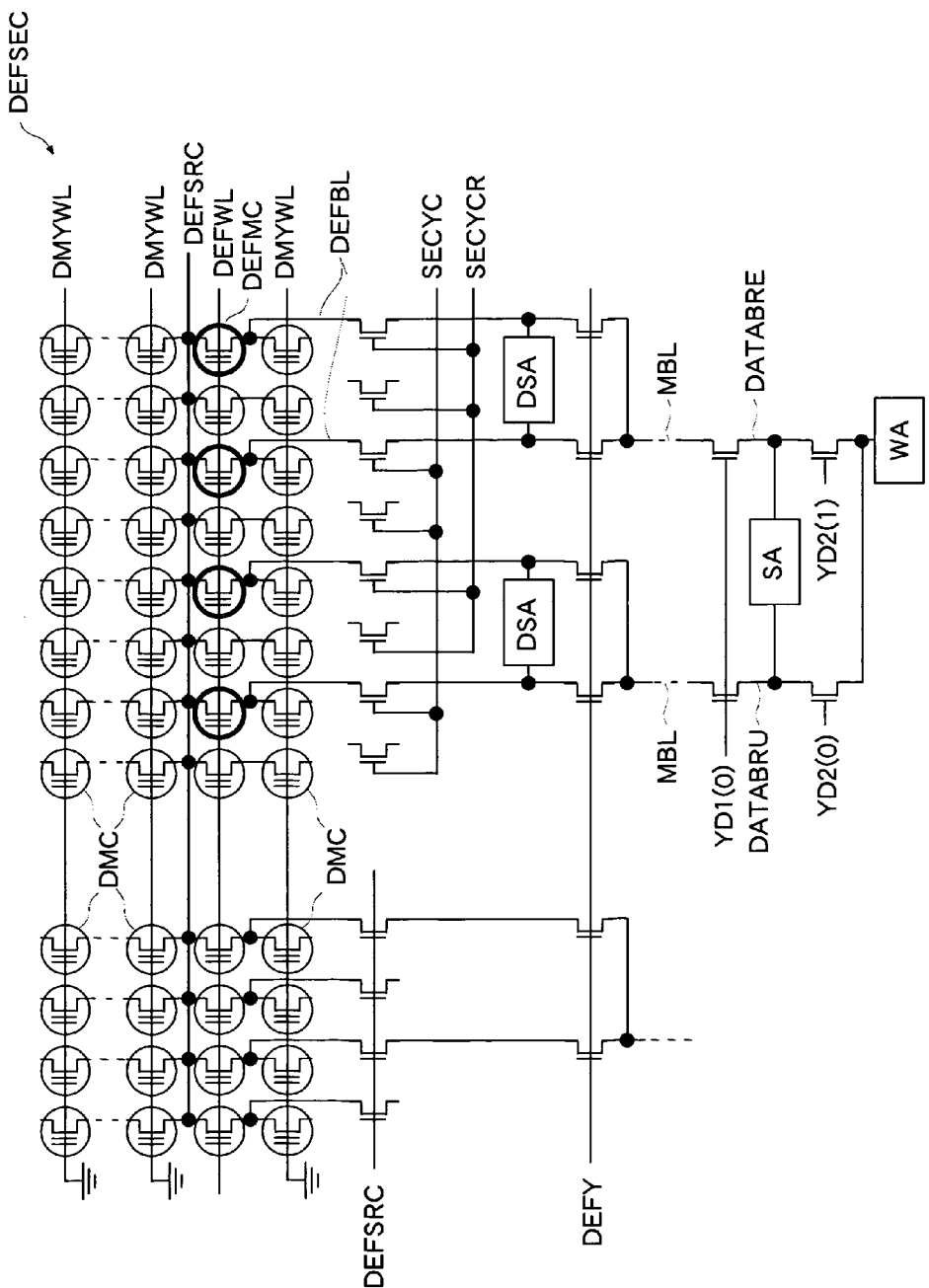
FIG. 7 is a block diagram showing details of a defect-information sector shown in FIG. 2.

FIG. 7 shows details of the defect-information sector DEFSEC shown in FIG. 2. As described in FIG. 4, the defect-information sector DEFSEC includes four nonvolatile defect-information memory cells DEFMC (bold circles in the figure) in each data area D0-31. The defect-information memory cells DEFMC are connected to only one defect-information word line DEFWL. Each defect-information memory cell DEFMC is connected to the defect-information sense amplifier DSA via the defect-information bit line DEFBL and the switch (nMOS transistor) which receives the defect-information decode signal SECYC, SECYCR at its gate.

All memory cells except the defect-information memory cells DEFMC are the dummy memory cells DMC. Sources of the defect-information memory cells DEFMC and the dummy memory cells DMC are connected to a defect-information source line DEFSRC. The dummy word lines DMYWL are grounded and fixed at 0 V (first voltage). Thereby, each defect-information bit line DEFBL is electrically connected to only one defect-information memory cell DEFMC. Accordingly, the defect-information memory cell DEFMC can be erased close to an over-erased level, and thereby the read margin of the defect information can be improved.

A pair of defect-information memory cells DEFMC corresponding to each main bit line MBL stores one piece of defect information as complementary data. Therefore, the defect-information sector DEFSEC can store 64 pieces of defect information. In this embodiment, as defect information to relieve a defect, eight bits are needed for each redundancy data area RD0-1. More specifically, bits needed to store the defect information indicating the position of the defective regular memory cell MC are two bits to distinguish the sub-data areas SD0-3, five bits to distinguish the data terminals I/O0-31, and one bit to enable each redundancy data area RD0-1. Hence, 16 bits in total are needed to use two redundancy data areas RD0-1.

In this embodiment, 16 pairs of defect-information memory cells DEFMC are used, and 48 pairs of defect-information memory cells DEFMC are not used. There are spare defect-information memory cells DEFMC, so that, for example, it is possible to perform defect relief to each two regular sectors RGLSEC adjacent vertically shown in FIG. 2. In this case, the relief efficiency increases, so that the yield of the memory MEM can be improved.

On the other hand, when the data terminal I/O is composed of 16 bits (I/O0-15) although not relating directly to this embodiment, 16 regular data areas D0-15 are formed. On this occasion, the defect-information sector DEFSEC includes 32 pairs of defect-information memory cells DEFMC. Also in this case, two redundancy data areas RD0-1 can be formed.

In this embodiment, as described above, four defect-information memory cells DEFMC are formed for each regular data area D0-31. By forming a minimum number of defect-information memory cells DEFMC, the time required for a program operation of the defect-information memory cell DEFMC can be minimized. As a result, the test time in the test process of the memory MEM can be shortened.

Figure 8:
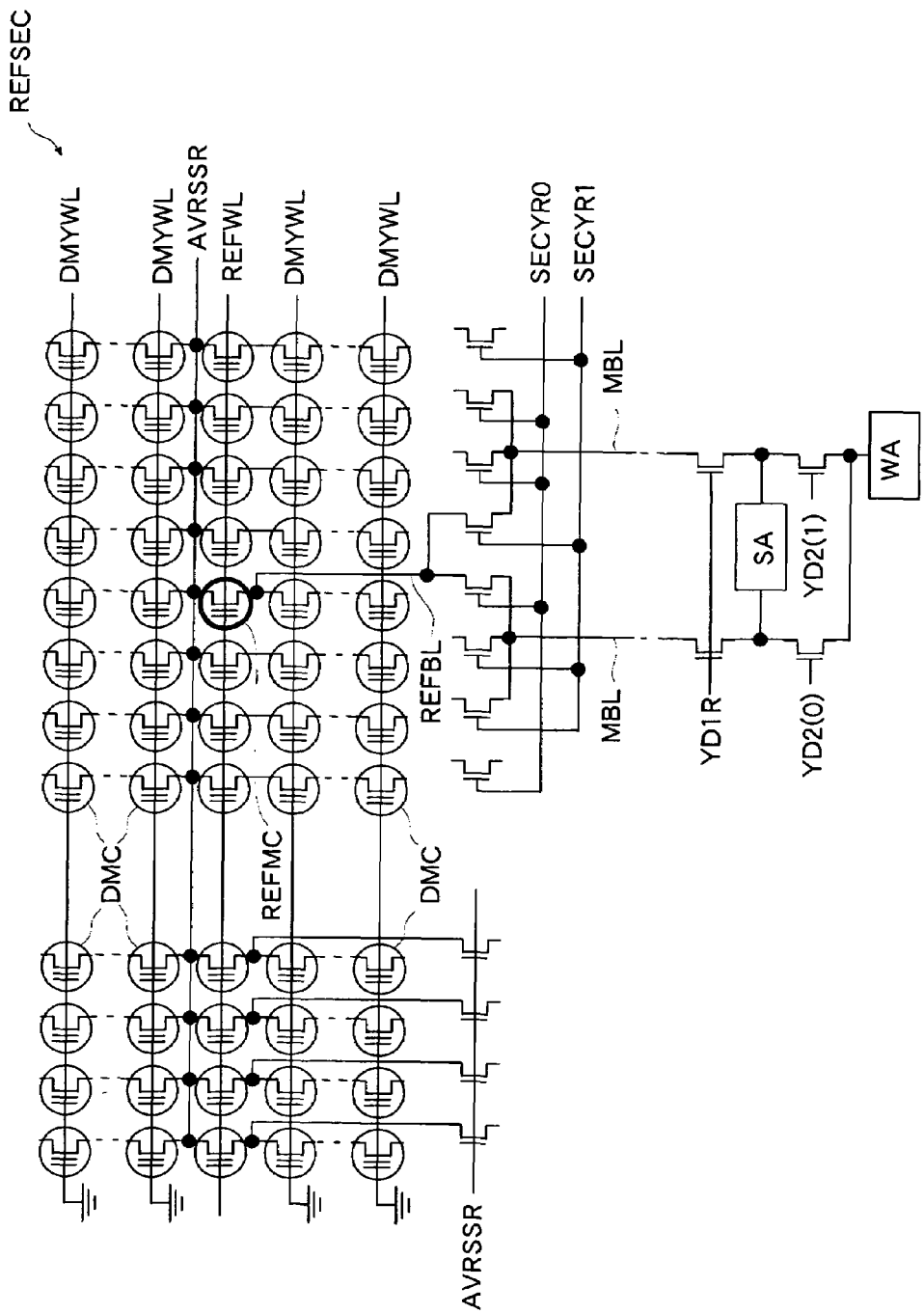
FIG. 8 is a block diagram showing details of a reference sector shown in FIG. 2.

FIG. 8 shows details of the reference sector REFSEC shown in FIG. 2. As described in FIG. 5, the reference sector REFSEC includes one nonvolatile reference memory cell REFMC (bold circle in the figure) in each data area D0-31. The reference memory cell REFMC is connected to only one reference word line REFWL. As in the defect-information sector DEFSEC shown in FIG. 7, all memory cells except the reference memory cells REFMC are the dummy memory cells DMC.

Sources of the reference memory cell REFMC and the dummy memory cells DMC are connected to a reference source line AVRSSR. The dummy word lines DMYWL are grounded and fixed at 0 V (first voltage). Accordingly, one reference bit line REFBL is electrically connected to only one reference memory cell REFMC. Therefore, the reference memory cell REFMC can be erased close to an over-erased level, so that in the test process, the threshold voltage of the reference memory cell REFMC can be set precisely.

For example, the threshold voltage of the reference memory cell REFMC is set to a median value between the threshold voltage of the regular memory cell MC which stores a high logic level and the threshold voltage of the regular memory cell MC which stores a low logic level. When data is read from the regular memory cell MC connected to one of the main bit lines MBL in the read operation, the reference memory cell REFMC is connected to the other of the main bit lines MBL by the reference decoded signal SECYR0-1.

Cell currents of the regular memory cell MC and the reference memory cell REFMC flowing to the pair of main bit lines MBL are converted to voltages, respectively, by a cascoder formed in the sense amplifier SA. Then, by differentially amplifying a difference between the converted voltages by the sense amplifier SA, binary data stored in the regular memory cell MC can be read.

In this embodiment, as described above, the reference memory cell REFMC is formed for each regular data area D0-31 and each redundancy data area RD0-1. By forming a minimum number of reference memory cells REFMC, the time required for a program operation of the reference memory cell REFMC can be minimized. As a result, the test time in the test process of the memory MEM can be shortened.

Further, by forming the reference memory cells REFMC in the memory cell array ARY, a wiring load of the main bit line MBL connected to the reference memory cell REFMC can be easily matched with a wiring load of the main bit line MBL connected to the regular memory cell MC to be accessed. Even if the fabricating condition of the memory MEM is changed, the characteristics of the wiring loads shift to the same side, so that they always match. In contrast, when the reference memory cells REFMC are formed outside the memory cell array ARY, a dummy load is generally formed in order to match the wiring loads. However, since the characteristic of the dummy load changes with the change in the fabricating condition of the memory MEM, it cannot be perfectly matched with the characteristic of the wiring load of the main bit line MBL.

Figure 9:
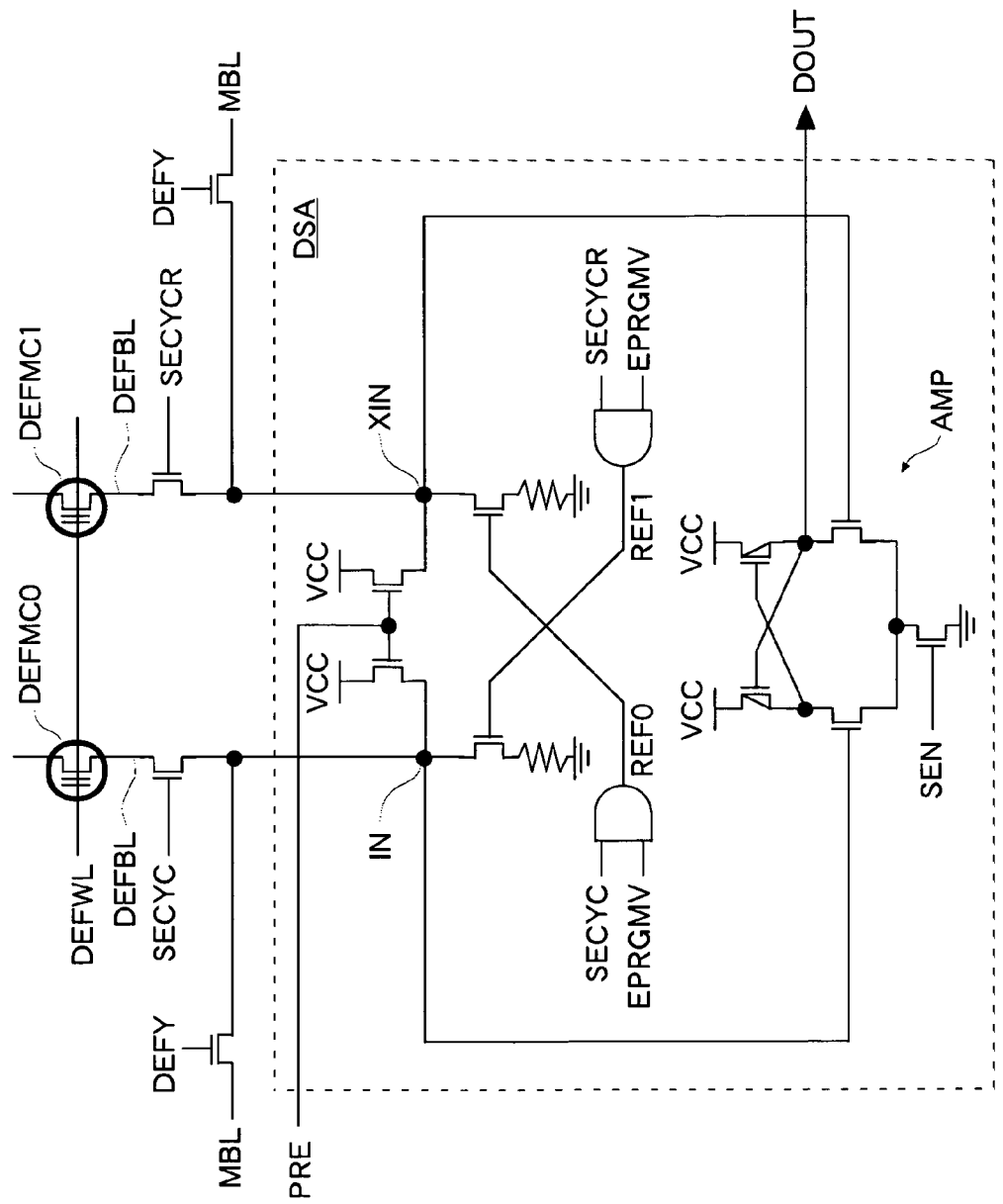
FIG. 9 is a circuit diagram showing details of a defect-information sense amplifier shown in FIG. 4.

FIG. 9 shows details of the defect-information sense amplifier DSA shown in FIG. 4. The defect-information sense amplifier DSA is used for a read operation of data from a pair of defect-information memory cells DEFMC0-1, a verify operation when data is written into each defect-information memory cell DEFMC0-1, and a verify operation when data written into the defect-information memory cell DEFMC0-1 is erased.

The defect-information sense amplifier DSA includes a pair of nMOS transistors which receive a precharge signal PRE at their gates, a pair of nMOS transistors which receive reference signals REF0-1 at their gates, respectively, and a differential amplifier AMP to whose complementary inputs input nodes IN, XIN are connected. The reference signal REF0 is generated by an AND logic of the defect-information decoded signal SECYC and an erase/program-verify signal EPRGMV. The reference signal REF1 is generated by an AND logic of the defect-information decoded signal SECYCR and the erase/program-verify signal EPRGMV.

The differential amplifier AMP includes a pMOS transistor and an nMOS transistor connected in series corresponding to each of the input nodes IN, XIN. A source of the pMOS transistor is connected to a power supply line VCC (for example, 3 V). A source of the nMOS transistor is connected to a ground line via an nMOS transistor which receives a sense amplifier enable signal SEN at its gate. Amplified data DOUT is outputted from a drain of the nMOS transistor connected to the input node XIN.

FIG. 10 shows operations of the defect-information sense amplifier DSA shown in FIG. 9. In this embodiment, a read operation RD is performed by reading the complementary data from the pair of defect-information memory cells DEFMC0-1. Therefore, in the read operation RD, the defect-information decoded signals SECYC, SECYCR are held at a high logic level H (hereinafter also referred to as an H level). Since the defect-information decoded signal DEFY is held at a low logic level L (hereinafter also referred to as an L level), the connection between the input nodes IN, XIN and the write amplifier WA is released. During the read operation RD, the erase/program-verify signal EPRGMV is held at the L level, so that the reference signals REF0-1 are held at the L level. By the H-level precharge signal PRE, a predetermined read current flows to the input nodes IN, XIN. The defect information word line DEFWL is changed to a high level (for example, VCC), and the current is extracted to the source line DEFSRC according to the threshold voltage of the defect-information memory cell DEFMC.

When the defect-information memory cells DEFMC0-1 connected to the input nodes IN, XIN are in a write state (programmed state, high-threshold voltage) and an erase state (low-threshold voltage), respectively, the voltage of the input node IN is larger than the voltage of the input node XIN. Hence, the differential amplifier AMP outputs the H-level read data DOUT.

In an erase operation ER, the defect-information memory cells DEFMC0-1 are connected to the write amplifier WA by the H-level defect-information decoded signals SECYC, SECYCR, DEFY. The reference signals REF0-1 are held at the L level by the L-level erase/program-verify signal EPRGMV. The supply of the read current to the input nodes IN, XIN is stopped by the L-level precharge signal PRE. Accordingly, the input nodes IN, XIN are brought into a floating state. By the L-level sense amplifier enable signal SEN, the differential amplifier AMP is deactivated. Hence, the defect-information word line DEFWL is set to −9 V, and electrons are emitted from floating gates of the pair of defect-information memory cells DEFMC0-1. Namely, the erase operation ER is performed.

In a verify operation EVR after the erase operation ER, according to the defect-information memory cell DEFMC (DEFMC0 or DEFMC1) to be verified, one of the defect-information decoded signals SECYC, SECYCR is set to the H level. By the H-level erase/program-verify signal EPRGMV, the reference signal REF (one of REF0-1) corresponding to the defect-information memory cell DEFMC to be verified changes to the L level. The reference signal REF (the other of REF0-1) corresponding to the defect-information memory cell DEFMC not to be verified changes to the H level. Thereby, the input node (IN or XIN) connected to the defect-information memory cell DEFMC not to be verified is grounded via a resistor and operates as a reference node. The connection between the input nodes IN, XIN and the write amplifier WA is released by the L-level defect-information decoded signal DEFY. The precharge signal PRE and the sense amplifier enable signal SEN are set to the H level, and the defect-information word line DEFWL is set to 0 V. When the voltage of the input node (one of IN, XIN) of the defect-information memory cell DEFMC to be verified becomes lower than the voltage of the input node (the other of IN, XIN) of the defect-information memory cell DEFMC not to verified, it is determined that the defect-information memory cell DEFMC is brought into an erase state. As just described, the verify operation EVR is performed on each defect-information memory cell DEFMC0-1.

A program operation PRG is performed on each defect-information memory cell DEFMC0-1. Therefore, according to the defect-information memory cell DEFMC (DEFMC0 or DEFMC1) to be programmed, one of the defect-information decoded signals SECYC, SECYCR is set to the H level. The reference signals REF0-1 change to the L level by the L-level erase/program-verify signal EPRGMV. The precharge signal PRE and the sense amplifier enable signal SEN are set to the L level. Thereby, a drain (one of IN, XIN) of the defect-information memory cell DEFMC to be programmed changes to the H level upon receiving an output from the write amplifier WA. A drain (the other of IN, XIN) of the defect-information memory cell DEFMC not to be programmed is brought into a floating state.

The defect-information decoded signal DEFY is set to the high logic level, and the nMOS transistor (defect-information switch) which receives the defect-information decoded signal DEFY at its gate is turned on. Consequently, the defect-information bit line DEFBL is connected to the regular bit line MBL and the write amplifier WA not shown. The defect-information word line DEFWL is set to 9 V, and electrons are injected into a floating gate of the defect-information memory cell DEFMC to be programmed. Since the defect-information memory cell DEFMC is connected to the main bit line MBL at the time of programming, the wiring load becomes larger. However, the defect-information memory cell DEFMC is programmed in the test process, so that an increase in program time caused by an increase in wiring load does not become a problem.

A verify operation PVR after the program operation PRG is the same as the verify operation EVR after the erase operation ER except that the defect-information word line DEFWL is set to VCC. Namely, the verify operation PVR is performed on each defect-information memory cell DEFMC0-1. By performing the program operation PRG and its verify operation PVR on each defect-information memory cell DEFMC0-1, the threshold voltage of the defect-information memory cell DEFMC0-1 can be certainly set to a predetermined value. Therefore, the defect information can be certainly stored, and the defect information can be certainly read.

Figure 11:
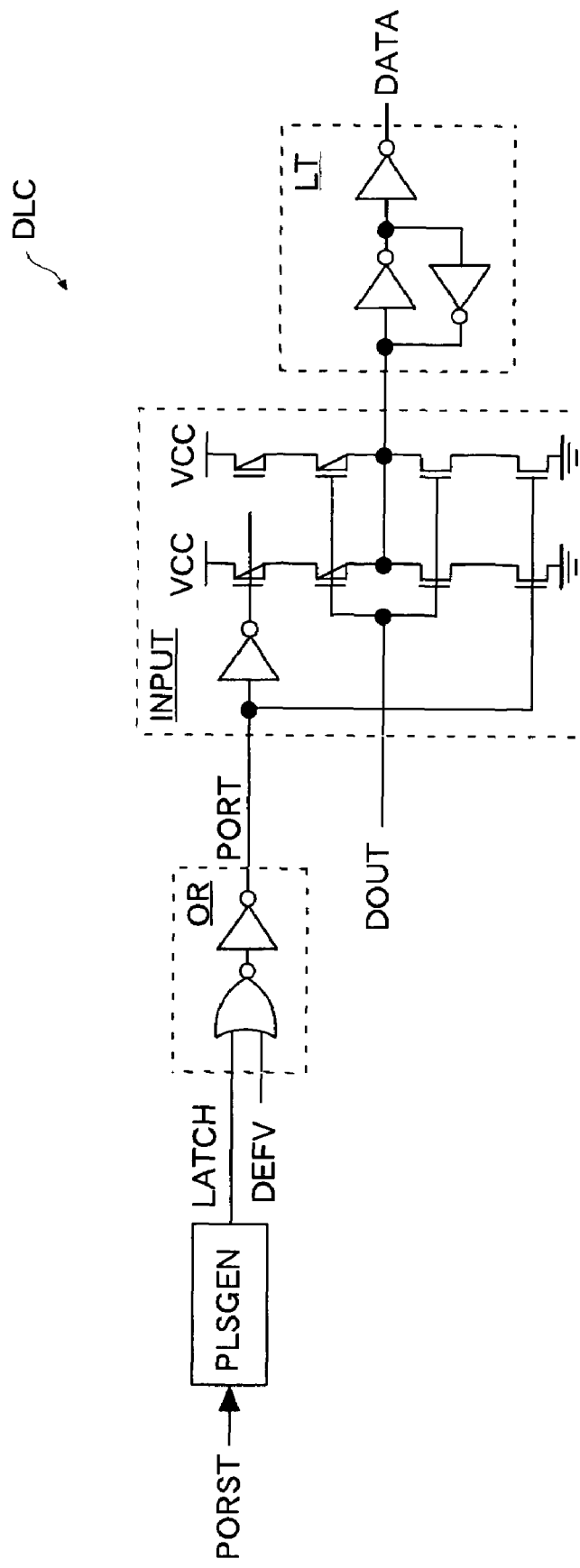
FIG. 11 is a block diagram showing details of a defect-information latch shown in FIG. 4.

FIG. 11 shows details of the defect-information latch DLC shown in FIG. 4. The defect-information latch DLC includes a pulse generating circuit PLSGEN, an OR circuit, an input circuit INPUT, and a latch circuit LT. The pulse generating circuit PLSGEN generates a latch signal LATCH (positive pulse signal) in response to a power-on reset signal PORST generated when the memory MEM is powered on. The OR circuit outputs the high logic-level latch signal LATCH or a high logic-level defect-information test signal DEFV as a power-on timing signal PORT to the input circuit INPUT. The defect-information test signal DEFV is set to the high logic level during the test mode in which the defect-information memory cell DEFMC0-1 is programmed. Consequently, in the verify operation after the program operation and the verify operation after the erase operation, the logic read from the defect-information memory cell DEFMC0-1 can be read via the defect-information latch DLC.

The input circuit INPUT is constituted by connecting a pair of CMOS clock inverters in parallel. An nMOS transistor and a pMOS transistor as control gates of the input circuit INPUT receive the power-on timing signal PORT and its inverted signal, respectively. When the power-on timing signal PORT is at the high logic level, the input circuit INPUT inverts the logic of the read data DOUT received by an input terminal and transmits it to the latch circuit LT.

The latch circuit LT includes a pair of inverters whose outputs are connected to their inputs. The latch circuit LT holds the logic of the read data DOUT and outputs the held value as a data signal DATA. As just described, the latch circuit LT operates as a holding unit which holds the defect information read from the defect-information memory cells DEFMC.

Figure 12:
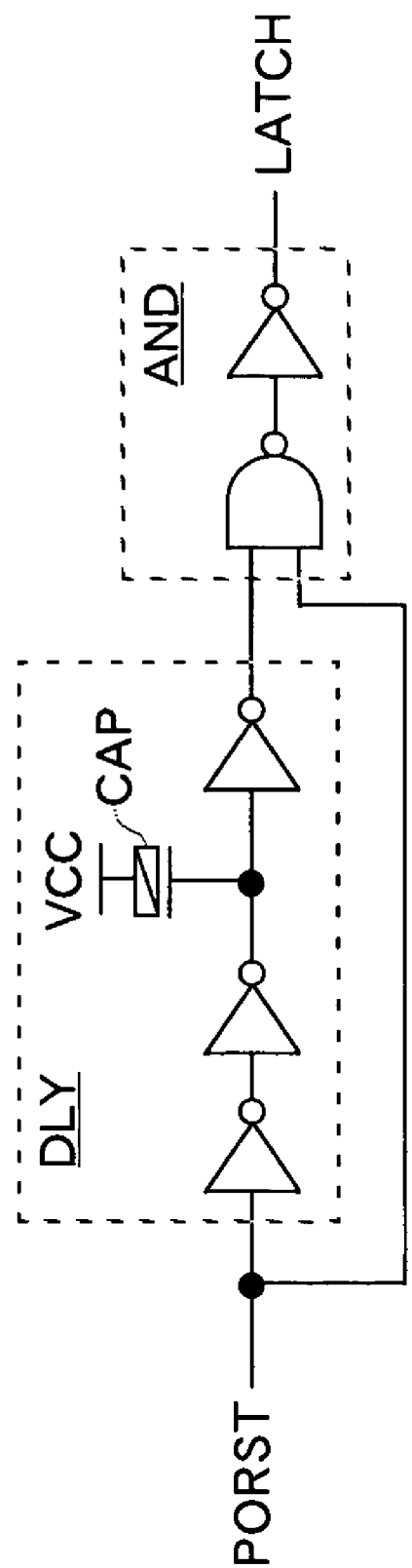
FIG. 12 is a circuit diagram showing details of a pulse generating circuit shown in FIG. 11.

FIG. 12 shows details of the pulse generating circuit PLSGEN shown in FIG. 11. The pulse generating circuit PLSGEN includes a delay circuit DLY which inverts and delays the power-on reset signal PORST and an AND circuit which receives the power-on reset signal PORST and its inverted delay signal. The delay circuit DLY includes a MOS capacitor CAP which connects a gate of a pMOS transistor to a transmission path of the delay signal and connects a source and a drain of the pMOS transistor to the power supply line VCC. The pulse generating circuit PLSGEN generates the latch signal (one-shot pulse) with a pulse width corresponding to a delay time (for example, 100 ns) of the delay circuit DLY in synchronization with a rising edge of the power-on reset signal PORST.

Figure 13:
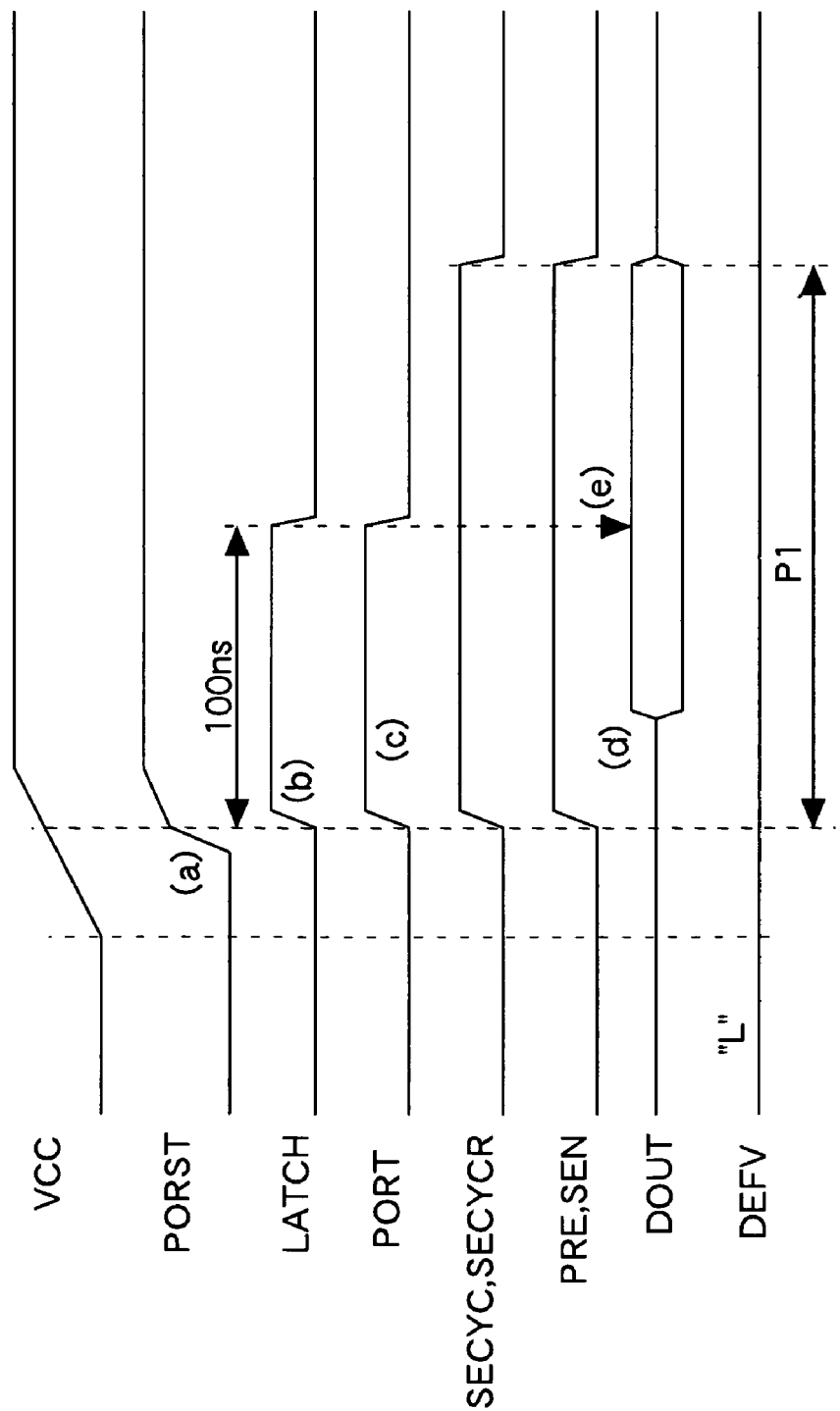

FIG. 13 shows the operations of the defect-information sense amplifier DSA and the defect-information latch DLC shown in FIG. 4 at power-on. When the power supply voltage VCC is supplied to the memory MEM (power on) and the power supply voltage VCC exceeds a predetermined voltage, the power-on reset unit 11 shown in FIG. 1 changes the power-on reset signal PORST from a lower level to a high level (FIG. 13(a)). In response to the change of the power-on reset signal PORST to the high level, the pulse generating circuit PLSGEN shown in FIG. 12 changes the latch signal LATCH to the high logic level for a period of about 100 ns (FIG. 13(b)).

The defect-information latch DLC shown in FIG. 11 outputs the power-on timing signal PORT in synchronization with the latch signal LATCH (FIG. 13(c)). In response to the change of the power-on reset signal PORST to the high level, the operation control unit 16 shown in FIG. 1 sets the defect-information decoded signals SECYC, SECYCR, the precharge signal PRE, and the sense amplifier enable signal SEN to the high logic level only for a period P1. The period P1 is set such that falling edges of the defect-information decoded signals SECYC, SECYCR, the precharge signal PRE, and the sense amplifier enable signal SEN come after a falling edge of the power-on timing signal PORT.

The defect-information sense amplifier DSA shown in FIG. 9 is activated during the period P1 in synchronization with power on, differentially amplifies a difference between signal amounts of complementary data read from the defect-information memory cells DEFMC0-1, and outputs it as the read data DOUT (FIG. 13(d)). The defect-information latch DLC latches the read data DOUT in synchronization with the falling edge of the power-on timing signal PORT (FIG. 13(e)).

Incidentally, although not shown in FIG. 13, when the defect information is written into the defect-information memory cell DEFMC0-1 in the test process before the shipment of the memory MEM, the defect-information test signal DEFV is held at the high logic level. In this case, since the input circuit INPUT always operates as an inverter, the defect-information latch DLC shown in FIG. 11 operates as a buffer which outputs the read data DOUT. Hence, as described above, in the verify operation after the program operation and the verify operation after the erase operation, the logic read from the defect-information memory cell DEFMC0-1 can be read via the defect-information latch DLC.

By reading the defect information indicating the defective memory cell MC from the defect-information memory cells DEFMC at power-on and holding it in the latch circuit LT, it becomes unnecessary to access the defect-information memory cells DEFMC each time the memory cell MC is accessed. Consequently, power consumption can be reduced. Besides, since the access time to the defect-information memory cells DEFMC need not be included in the access time (particularly, read access time), the access time can be shortened.

FIG. 14 shows the operation of the memory cell array ARY shown in FIG. 2. In this embodiment, the memory cell array ARY includes the regular memory cells MC (redundancy memory cells RMC), the defect-information memory cells DEFMC, and the reference memory cells REFMC as accessible memory cells. By controlling the memory cell array ARY in the following manner, the operation control circuit 16 performs the read operation, the write operation (or the program operation), the erase operation, and the verify operation on these memory cells MC (RMC), DEFMC, REFMC. The verify operation is performed on confirmation after the write operation, the program operation, and the erase operation.

"off" in this figure indicates that a switch (nMOS transistor) which receives the signal concerned is turned off. "on" in this figure indicates that a switch which receives the signal concerned is turned on. "sel" in this figure indicates that any of switches which receive the signal concerned is turned on. The defect-information decoded signals SECYC, SECYCR, DEFY are dedicated signals to access the defect-information memory cells DEFMC. Switches which receive these signals are turned off when the regular memory cell MC, the redundancy memory cell RMC, and the reference memory cell REFMC are accessed. Therefore, in an access mode of all the memory cells MC, RMC, REFMC, the main bit line MBL is completely cut off from the defect-information sector DEFSEC and the defect-information sense amplifier DSA. Accordingly, the write amplifier WA, the defect-information sector DEFSEC, and the defect-information sense amplifier DSA can be prevented from exerting an influence on the load on the main bit line MBL when the memory cells MC, RMC, REFMC are accessed.

Similarly, the reference memory cell REFMC is not used when the defect-information memory cell DEFMC is accessed. Hence, when the defect-information memory cell DEFMC is accessed, the reference memory cell REFMC is not used. Therefore, when the defect-information memory cell DEFMC is accessed, switches which receive the reference decoded signal YD1R, the redundancy decoded signal RYD1, the regular decoded signals SECY0-7, and the reference decoded signals SECYR0-1 are turned off.

In the following description, a switch which receives a decoded signal is represented by the name of the decoded signal. For example, a switch which receives the write decoded signal YD2(0) is represented as a switch YD2(0), and a switch which receives the defect-information decoded signal SECYC is represented as a switch SECYC.

In the read operation RD of the regular memory cell MC and the redundancy memory cell RMC, to connect the regular memory cell MC to be accessed to the sense amplifier SA via the main bit line MBL, in the data areas D0-31, any of switches SECY0-7 is turned on, and any of switches YD1(0)-YD1(3) is turned on. Moreover, to connect the reference memory cell REFMC to the main bit line MBL and the sense amplifier SA, either of switches SECYR0-1 is turned on, and the switch YD1R is turned on. Then, the sense amplifier SA reads data according to the difference in signal amount between a regular bit line pair MBL connected to the regular memory cell MC to be accessed and the reference memory cell REFMC.

At this time, also in the redundancy data areas RD0-1, a switch RYD1 are turned on, and the redundancy memory cell RMC and the reference memory cell REFMC in the redundancy data area RD0-1 are connected to the redundancy sense amplifier RSA. The redundancy sense amplifier RSA reads data according to a difference in signal amount between a regular bit line pair MBL connected to the redundancy memory cell RMC to be accessed and the reference memory cell REFMC. The regular word line WL and the reference word line REFWL are set to a boost voltage VBST (for example, 5 V).

On the other hand, by turning off the switches YD2(0)-(1) off, the main bit lines MBL are completely cut off from the write amplifier WA. Similarly by tuning switches SECYC, SECYCR, DEFY off, the main bit lines MBL are completely cut off from the defect-information sector DEFSEC and the defect-information sense amplifiers DSA.

In a write operation WR of the regular memory cell MC and the redundancy memory cell RMC, to connect the regular memory cell MC to be accessed to the write amplifier WA via the main bit line MBL, in the data areas D0-31, any of the switches SECY0-7 is turned on, any of the switches YD1(0)-YD1(3) is turned on, the switch RYD1 is turned on, and either of the switches YD2(0)-(1) is turned on. By the above operation, also in the redundancy data areas RD0-1, the redundancy memory cell RMC is connected to the redundancy write amplifier WA. The regular word line WL is set, for example, to 9 V.

In the erase operation ER of the regular memory cell MC and the redundancy memory cell RMC, in each regular sector RGLSEC, the switches YD1(0)-YD1(3), RYD1, SECY0-7 are turned on, and the other switches are turned off. The regular word line WL is set, for example, to −9 V. The reference memory cells REFMC and the defect-information memory cells DEFMC are formed in independent sectors REFSEC, DEFSEC. Respective sectors are wired independently by the source lines connected to the memory cells MC, REFMC, DEFMC, so that the reference memory cells REFMC and the defect-information memory cells DEFMC are not influenced by the erase operation of the regular memory cell MC.

In the verify operation VR of the regular memory cell MC and the redundancy memory cell RMC, to connect the memory cells MC, RMC to be verified to the sense amplifiers SA, RSA via the main bit lines MBL, in the data areas D0-31, any of the switches SECY0-7 is turned on, any of the switches YD1(0)-YD1(3) is turned on, and the switch RYD1 is turned on. Moreover, to supply a reference voltage during the verify operation from the write amplifier WA, either of the switches YD2(0)-(1) is turned on. The regular word line WL is set to 3-5 V.

The read operation of the defect-information memory cells DEFMC is performed in the same manner as in FIG. 10 described above, using the dedicated defect-information sense amplifier DSA. To release a connection between the regular sense amplifier SA and the main bit lines MBL, the switches YD2(0)-(1), YD1(0)-(3) are turned off.

In the program operation PRG of the defect-information memory cell DEFMC, to connect any of the defect-information memory cells DEFMC to the write amplifier WA, either of the switches SECYC, SECYCR is turned on, any of the switches YD1(0)-(3) it turned on, and either of the switches YD2(0)-(1) is turned on. As described above, the program operation PRG is performed on each defect-information memory cell DEFMC.

In the erase operation ER of the defect-information memory cells DEFMC, the switches YD1(0)-(3), RYD1, SECY0-7, SECYC, SECYCR, DEFY are turned on, and the other switches are turned off. Data in all the defect-information memory cells DEFMC in the defect-information sector DEFSEC are erased at a time.

The verify operation VR of the defect-information memory cell DEFMC is performed in the same manner as in FIG. 10 described above, using the dedicated defect-information sense amplifier DSA. More specifically, either of the switches SECYC, SECYCR is turned on, and the other switches are turned off. In the verify operation after the erase operation, the defect-information word line DEFWL is set to 0 V. In the verify operation after the program operation, the defect-information word line DEFWL is set to VCC.

The read operation RD of the reference memory cell REFMC is the same as the read operation of the regular memory cell MC. In the program operation PRG of the reference memory cell REFMC, to connect the reference memory cell REFMC to be accessed to the write amplifier WA via the main bit line MBL, either of the switches SECYR0-1 is turned on, the switch YD1 R is turned on, and either of the switches YD2(0)-(1) is turned on. The reference word line REFWL is set to 2-3 V.

In the erase operation ER of the reference memory cells REFMC, only the switches YD1R, SECYR0-1 are turned on, and the other switches are tuned off. The reference word line REFWL is set, for example, to −9 V. Data in all the reference memory cells REFMC in the reference sector REFSEC are erased at a time.

In the verify operation VR of the reference memory cell REFMC, to connect the reference memory cell REFMC to be verified to the sense amplifier SA, either of the switches SECYR0-1 is turned on, the switch YD1R is turned on, and either of the switches YD2(0)-(1) is turned on. The reference word line REFWL is set to 3-5 V.

As shown in FIG. 4 and FIG. 5, by arranging the defect-information memory cells DEFMC and the reference memory cells REFMC in the memory cell array ARY in the same manner as the regular memory cells MC, the defect-information memory cell DEFMC and the reference memory cell REFMC can be accessed in the same manner as access to the regular memory cell MC, using the common operation control unit 16. As a result, the logic of the control circuit to access the defect-information memory cell DEFMC and the reference memory cell REFMC can be reduced, and thereby the chip size of the memory MEM can be reduced.

Moreover, by forming the defect-information memory cells DEFMC, the regular memory cells MC, and the reference memory cells REFMC in the sectors DEFSEC, RGLSEC, REFSEC different from one another, it can be prevented that the access operation of one sector influences the other sectors. Consequently, the operation margin of the memory MEM can be improved.

As described above, in the first embodiment, the regular sense amplifier SA and the defect-information sense amplifier DSA are formed corresponding to the regular sector RGLSEC and the defect-information sector DEFSCE, respectively, which can prevent excess wiring and switches from being arranged in a path from the regular memory cell MC to the regular sense amplifier SA. As a result, the normal read operation of reading data from the regular memory cell MC can be performed at high speed.

By providing the write amplifier WA in common to the regular sector RGLSEC and the defect-information sector DEFSEC, the circuit scale can be made smaller without lengthening the read access time, and thereby the fabrication cost of the memory MEM can be reduced.

By reading the defect information from the defect-information memory cells DEFMC at power-on and holding it in the latch circuit LT, determining the presence or absence of a defect using the held defect information, and enabling the redundancy memory cell RMC in place of the regular memory cell MC to be accessed, the power consumption of the memory MEM can be reduced. Moreover, the read access time can be shortened.

By forming the defect-information memory cells DEFMC and the reference memory cells REFMC respectively in the defect-information sector DEFSEC and the reference sector REFSEC in the memory cell array ARY, the defect-information memory cells DEFMC and the reference memory cells REFMC having the same characteristic as the regular memory cells MC can be easily formed. Moreover, since cells used in layout design can be made common, the design period can be shortened.

Figure 15:
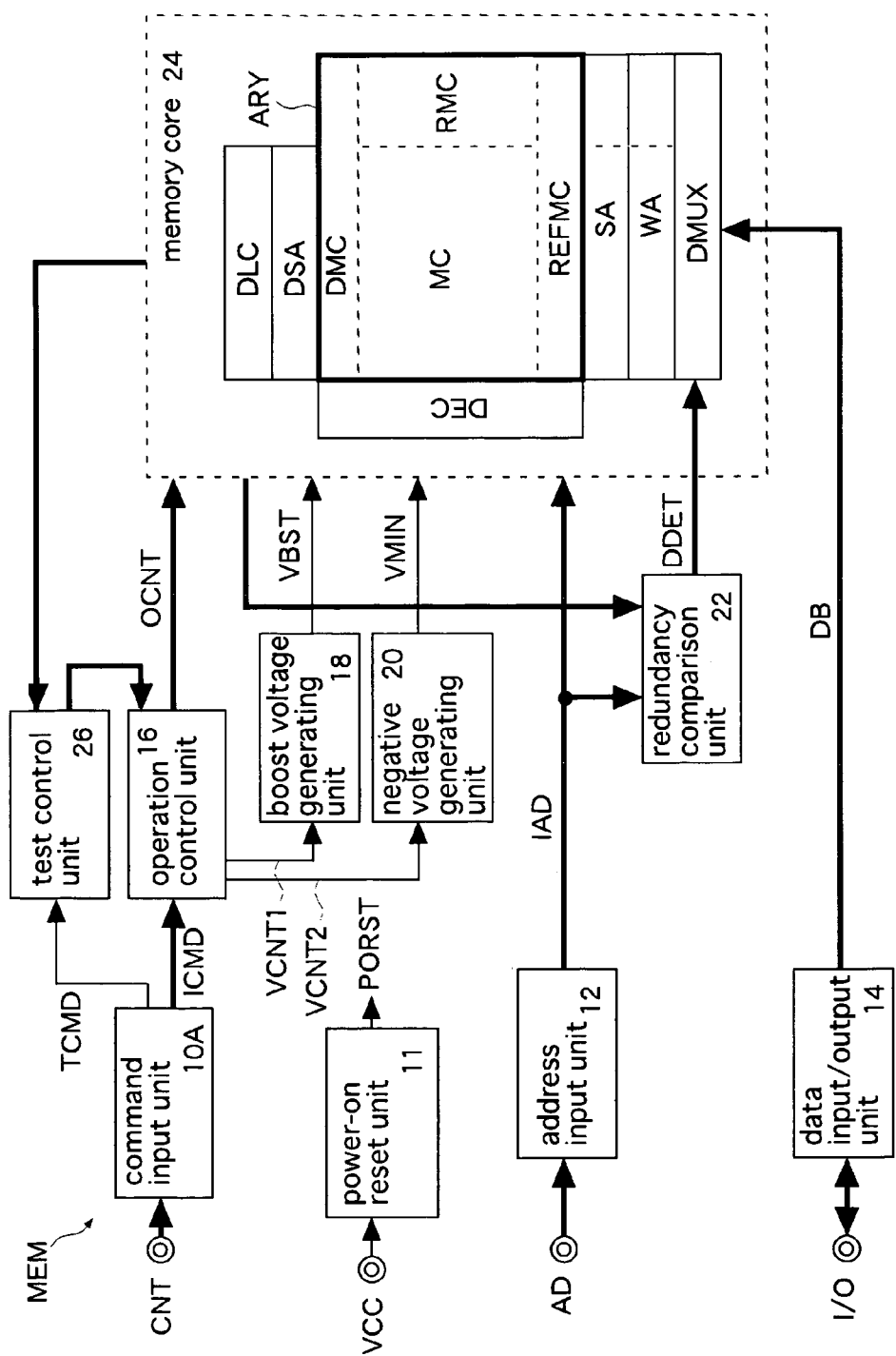
FIG. 15 is a block diagram showing a nonvolatile semiconductor memory of a second embodiment of the present invention.

FIG. 15 shows a nonvolatile semiconductor memory of a second embodiment of the present invention. The same numerals and symbols will be used to designate the same elements as those described in the first embodiment, and the detailed description thereof will be omitted. The semiconductor memory MEM of this embodiment includes a command input unit 10A in place of the command input unit 10 of the first embodiment. The semiconductor memory MEM newly includes a test control unit 26. The other configuration is the same as that of the first embodiment. Namely, the semiconductor memory MEM is formed as a NOR-type flash memory.

The command input unit 10A includes a function of receiving a test command TCMD to operate a test control unit 26 in the command input unit 10 of the first embodiment. The test command TCMD is supplied to the memory MEM in an operation test before the shipment of the memory MEM. When receiving the test command TCMD, the test control unit 26 operates to set the threshold voltage of the reference memory cell REFMC to a predetermined value. More specifically, the test control unit 26 allows the operation control unit 16 to perform the program operation and the verify operation of the reference memory cell REFMC. The test control unit 26 reads a result of the verify operation from the memory cell array ARY, and repeatedly performs the program operation and the verify operation of the reference memory cell REFMC until the threshold voltage of the reference memory cell REFMC is set to the predetermined value.

As just described, also in the second embodiment, the same effect as in the above first embodiment can be obtained. Further, in this embodiment, the threshold voltage of the reference memory cell REFMC can be automatically set to the predetermined value by the test control unit 26. Accordingly, the time required for the test process before the shipment of the memory MEM can be shortened, and thereby the fabrication cost of the memory MEM can be reduced.

Incidentally, in the above embodiments, the example in which the present invention is applied to the NOR-type flash memory is described. The present invention is not limited to these embodiments. For example, the present invention may be applied to a NAND-type flash memory.

In the above embodiments, the example in which the memory cells MC, DEFMC, REFMC, RMC, DMC each having the floating gate is described. The present invention is not limited to these embodiments. For example, memory cells MC, DEFMC, REFMC, RMC, DMC each having a trap gate may be used.

In the above embodiments, the example in which the sub-data areas SD0-3 are constituted by connecting eight sub-bit lines SBL to each of four pairs of main bit lines MBL is described. The present invention is not limited to these embodiments. For example, the sub-data areas SD0-3 may be constituted by connecting 16 sub-bit lines SBL to each of two pairs of main bit lines MBL. The present invention is applicable as long as the main bit lines MBL make pairs.

In the above embodiments, the example in which the present invention is applied to the I/O redundancy system memory MEM is described. The present invention is not limited to these embodiments. For example, the present invention may be applied to an address redundancy system memory MEM.

In the above embodiments, the example in which the one-shot pulse (LATCH) is generated in synchronization with the power-on reset signal PORST by the pulse generating circuit PLSGEN is described. The present invention is not limited to these embodiments. For example, when the memory MEM is a synchronous type of a clock, the latch signal LATCH having a high-level period corresponding to one cycle of a clock may be generated by a clock circuit such as a Dflip-flop circuit which operates in synchronization with the clock.

The invention is not limited to the above embodiments and various modifications may be made without departing from the spirit and scope of the invention. Any improvement may be made in part or all of the components.

What is claimed is:

1. A nonvolatile semiconductor memory, comprising:
   a regular sector which includes a plurality of nonvolatile regular memory cells, regular bit lines connected to said regular memory cells, a nonvolatile redundancy memory cell to relieve a defective regular memory cell, and a redundancy bit line connected to said nonvolatile redundancy memory cell;
   a defect-information sector which includes a plurality of nonvolatile defect-information memory cells storing defect information indicating a position of the defective regular memory cell, and which includes defect-information bit lines connected to said defect-information memory cells;
   a regular sense amplifier which is connected to the regular bit line to read data stored in said regular memory cells;
   a defect-information sense amplifier which is connected to the defect-information bit line to read said defect information stored in said defect-information memory cells;
   a write amplifier which is connected to the regular bit line to write data into said regular memory cells; and
   a defect-information switch which connects the defect-information bit line to the regular bit line in order to write said defect-information into said defect-information memory cells using said write amplifier.

2. The nonvolatile semiconductor memory according to claim 1, further comprising:
   a power-on control unit which activates said defect-information sense amplifier to read said defect information from said defect-information memory cells when a power supply to the nonvolatile semiconductor memory is detected;
   a holding unit which holds said defect information read from said defect-information sense amplifier; and
   an access switching circuit which, when said defect information held by said holding unit indicates a position of the regular memory cell to be accessed, enables said redundancy memory cell in stead of the regular memory cell to be accessed.

3. The nonvolatile semiconductor memory according to claim 1, further comprising:
   a reference sector which includes a reference memory cell and a reference bit line connected to said reference memory cell; and
   a reference switch which connects said reference memory cell to the regular bit line connected to the regular memory cell not to be accessed via said reference bit line, wherein
   said regular sense amplifier reads data according to a difference in signal amount between a regular bit line pair connected to the regular memory cell to be accessed and to said reference memory cell.

4. The nonvolatile semiconductor memory according to claim 3, further comprising
   a plurality of reference word lines arranged in said reference sector, wherein
   said reference memory cell is connected to one of said reference word lines; and
   the reference word line not connected to said reference memory cell is fixed to a first voltage.

5. The nonvolatile semiconductor memory according to claim 4, further comprising
   a plurality of data terminals which input and output data, wherein said regular sector includes a plurality of regular data areas respectively corresponding to said data terminals, and a redundancy data area to relieve one of said regular data areas having a defect; and said reference memory cell is formed in each of said regular data areas and said redundancy data area.

6. The nonvolatile semiconductor memory according to claim 5, wherein said reference sector includes a plurality of dummy memory cells connected to said reference word lines, respectively.

7. The nonvolatile semiconductor memory according to claim 3, wherein said defect-information sector and said reference sector include a plurality of dummy memory cells; and said regular memory cells, said defect-information memory cells, said reference memory cell, and said dummy memory cells have a same cell structure and are laid out at same intervals.

8. The nonvolatile semiconductor memory according to claim 3, further comprising a test control unit which operates during a test mode and repeatedly performs a program operation and a verify operation on said reference memory cell until a threshold voltage of said reference memory cell is set to a predetermined value.

9. The nonvolatile semiconductor memory according to claim 1, further comprising a plurality of defect-information word lines arranged in said defect-information sector, wherein said defect-information memory cells are connected to one of said defect-information word lines; and the defect-information word line not connected to said defect-information memory cells is fixed to a first voltage.

10. The nonvolatile semiconductor memory according to claim 1, wherein said defect-information is stored as complementary data in a pair of the defect-information memory cells; and said defect-information sense amplifier differentially amplifies data read from the pair of the defect-information memory cells via said defect-information bit lines.

11. The nonvolatile semiconductor memory according to claim 10, further comprising a plurality of data terminals which input and output data, wherein said defect-information sector includes a plurality of defect-information data areas respectively corresponding to said data terminals; and at least a pair of the defect-information memory cells are formed in each of said defect-information data areas.

12. The nonvolatile semiconductor memory according to claim 1, wherein each of said regular bit lines includes a main bit line connected to said regular sense amplifier via switches and a plurality of sub-bit lines connected to said main bit line via switches.

* * * * *